US007107563B1

(12) United States Patent
Kong

(10) Patent No.: US 7,107,563 B1
(45) Date of Patent: *Sep. 12, 2006

(54) INTEGRATED CIRCUIT SIGNAL ROUTING USING RESOURCE COST ASSIGNMENT AND COSTING DATA

(75) Inventor: Raymond Kong, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 125 days.

This patent is subject to a terminal disclaimer.

(21) Appl. No.: 10/600,846

(22) Filed: Jun. 19, 2003

Related U.S. Application Data

(60) Provisional application No. 60/390,654, filed on Jun. 20, 2002.

(51) Int. Cl.
*G06F 17/50* (2006.01)

(52) U.S. Cl. ..................................................... 716/12
(58) Field of Classification Search ............ 716/11–17
See application file for complete search history.

(56) References Cited

U.S. PATENT DOCUMENTS 6,023,565 A * 2/2000 Lawman et al. ................ 716/1
6,099,583 A * 8/2000 Nag ............................ 716/16
6,349,403 B1 * 2/2002 Dutta et al. .................. 716/12
6,501,297 B1 12/2002 Kong
2003/0066043 A1 * 4/2003 Teig et al. ..................... 716/13

OTHER PUBLICATIONS

U.S. Appl. No. 10/600,857, filed Jun. 19, 2003, Kong et al.
J. Soukup; "Fast Maze Router"; Proceedings of Design Automation Conference, 1978; pp. 100-102.
Bryan T. Preas et al.; "Physical Design Automation of VLSI Systems"; The Benjamin/Cummings Publishing Company, Inc.; Copyright 1988; pp. 163-167.
C.Y. Lee, "An Algorithm for Path Connections and its Applications," IRE Transactions on Electronic Computers, vol. EC=10, Sep. 1961, pp. 346-365.

* cited by examiner

*Primary Examiner*—Vuthe Siek
(74) *Attorney, Agent, or Firm*—W. Eric Webostad

(57) ABSTRACT

Method, apparatus, and computer readable medium for determining signal routing cost within an integrated circuit is described. In an example, the integrated circuit is divided into topology units and includes routing resources. A respective span is determined in terms of one or more of the topology units for each of the routing resources. A cost value is assigned to each of the routing resources using the respective span associated therewith. A routing resource is selected from the routing resources. At least one distance between the routing resource and at least one other of the routing resources is calculated. A future cost value for the at least one distance is computed using the cost value assigned to the routing resource.

20 Claims, 7 Drawing Sheets

INTEGRATED CIRCUIT SIGNAL ROUTING USING RESOURCE COST ASSIGNMENT AND COSTING DATA

This application claims benefit of 60/390,654 filed Jun. 20, 2002.

FIELD OF THE INVENTION

The invention generally relates to signal routing in integrated circuits (ICs) and, more particularly, to generic signal routing using resource cost assignment and future costing data.

BACKGROUND OF THE INVENTION

A programmable logic device (PLD) is a digital circuit implementation platform that can be configured by the end user to implement a logic circuit of their choice. The two most common types of PLDs are field-programmable gate arrays (FPGAs) and complex programmable logic devices (CPLDs). Many PLD vendors provide computed-aided design tools to help their customers to implement logic designs in their PLDs. One type of PLD, the FPGA, is used as an example to illustrate the invention. It should be noted that, in addition to PLDS, the invention is applicable to other integrated circuit implementation technologies, for example, application specific integrated circuits (ASICs), mask-programmed gate arrays, and standard cell devices.

In a conventional architecture, an FPGA includes an array of configurable logic blocks (CLBs) surrounded by programmable input/output blocks (IOBs). The CLBs and IOBs are interconnected by a hierarchy of programmable routing resources, which are comprised of metal wire segments and programmable routing switches, also referred to as programmable interconnection points (PIPs). These CLBs, IOBs, and programmable routing resources are customized by loading a configuration bitstream into the FPGA. State-of-the art FPGAs contain tens of thousands of CLBs. For such devices, the task of establishing the required interconnections between the primitive cells inside a CLB and between the CLBs themselves becomes so onerous that it can only be accomplished within a reasonable amount of time with the assistance of computed-aided design tools. Accordingly, the manufacturers of FPGAs have developed place and route software tools which may be used by end customers to implement their respective designs in their FPGAs.

Routing tools are very important in determining the performance of a circuit implemented within an FPGA. If signals are not routed properly, an excessive amount of resources are used to carry signals. This could lead to a design with poor timing and power performance. Furthermore, routing tools are very difficult to develop and very time consuming to execute. Consequently, it is important to improve routing tools.

SUMMARY OF THE INVENTION

"Future costing" is a well-known method used to improve the run-time required to route signals in integrated circuits. One aspect of the invention involves a method for determining and using future cost in routing. To the router, the integrated circuit interconnect is modeled using a routing graph, containing a set of nodes and directed edges. The nodes in the graph represent conductors in the integrated circuit. Edges are present between nodes that correspond to conductors that can be electrically connected to one another.

In one embodiment, a two-dimensional table is used to store future cost data. The entries in the table are indexed by x and y distances between nodes in the routing graph. To populate the table with future cost values, pre-routing is performed form a specially chosen source node to other nodes in the routing graph. At each node visited during pre-routing, both the cumulative routing cost and the x and y distances from the source node are computed. If there is no entry in the table that corresponds to the specific x, y-distance, the cumulative routing cost is entered into the corresponding position in the table. If the table contains existing future cost data corresponding to this distance, the table entry is set equal to the cumulative routing cost if the cumulative routing cost is less than the value of the existing future cost data. Otherwise, the existing future cost data remains. The normal routing of a user's signals commences after the pre-routing is completed. During routing, values form the future cost table are used to reduce run-time needed for routing a design's signals.

Other aspects of the invention include a method, apparatus, and computer readable medium for determining signal routing cost within an integrated circuit. In an embodiment, the integrated circuit is divided into topology units and includes routing resources. A respective span is determined in terms of one or more of the topology units for each of the routing resources. A cost value is assigned to each of the routing resources using the respective span associated therewith. A routing resource is selected from the routing resources. At least one distance between the routing resource and at least one other of the routing resources is calculated. A future cost value for the at least one distance is computed using the cost value assigned to the routing resource.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
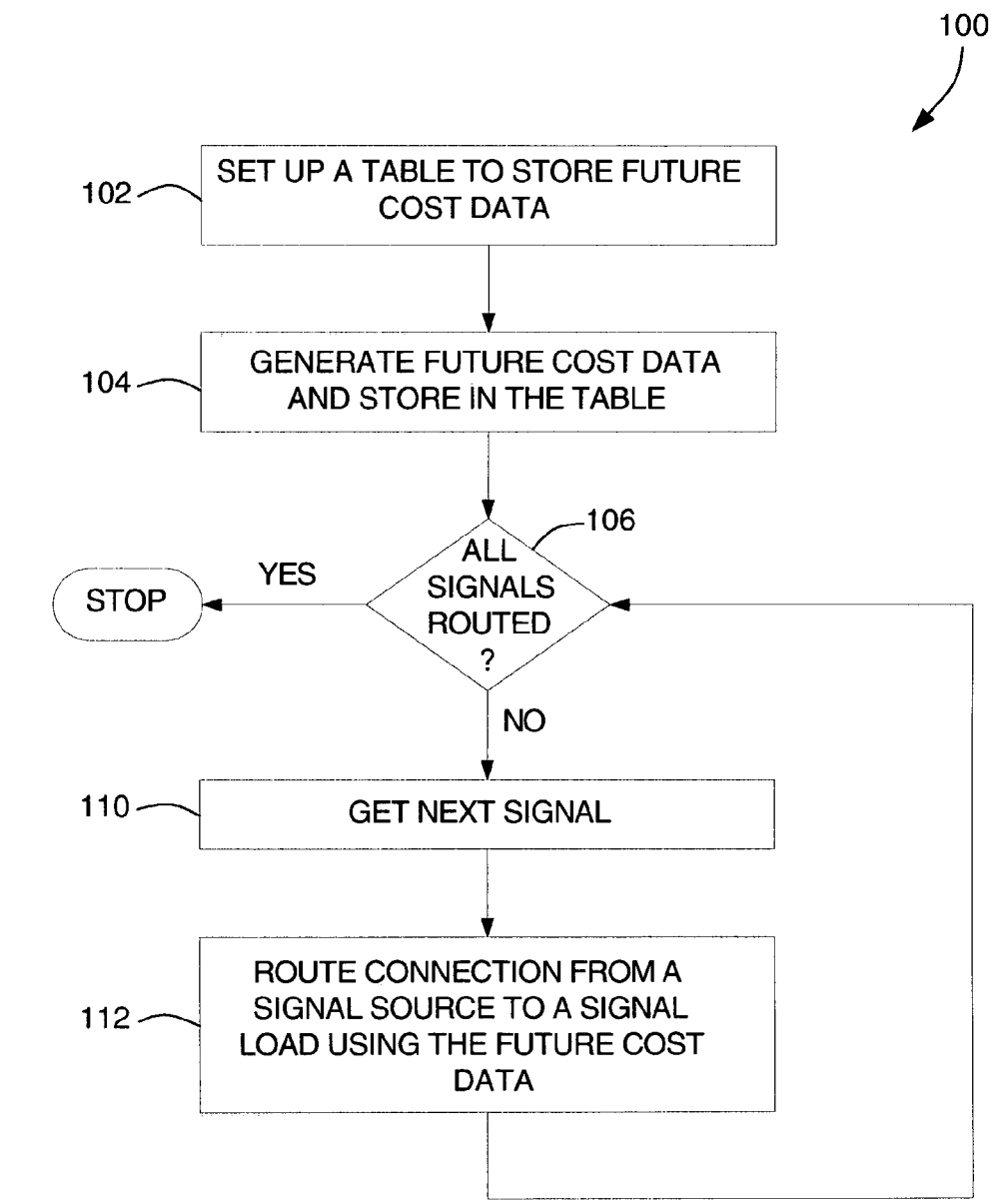
FIG. 1 is a flow chart showing an exemplary embodiment of a routing process.

The invention relates to a new method for routing signals. In the following description, numerous specific details are set forth in order to provide a more thorough understanding of the invention. However, it will be apparent to one skilled in the art that the invention may be practiced without these specific details. In other instances, well-known features have not been described in detail in order to avoid obscuring the invention.

A widely used algorithm used for routing signals in PLD devices is a variant form of the well-known maze router, as described in C. Y. Lee, "An Algorithm for Path Connections and its Applications," in IRE Trans. on Electronic Computers, Vol. EC=10, 1961, pp. 346–365. This technique is general and adapts very well to some PLD interconnect architectures, such as the FPGA routing fabric. From the router's perspective, the integrated circuit interconnect is modeled by a "routing graph", containing a set of nodes and directed edges. The nodes in the routing graph represent conductors in the integrated circuit. Edges are present between nodes corresponding to conductors that can be electrically connected to one another.

For example, in FPGA devices, edges are present between nodes corresponding to conductors that may be connected to each other through a programmable routing switch. A signal in a design is a set of pins that must be connected together electrically. A signal is generally comprised of a source pin and one or more load pins. The pins on a signal correspond to specific nodes in the routing graph.

To route a signal, the router identifies paths between the signal's pin nodes in the routing graph. The maze router algorithm searches for a path between a signal source pin and load pins by performing a breadth first search on the routing graph. Nodes in the routing graph are assigned costs, corresponding to characteristics of their corresponding conductors (described below). The maze router's goal is to find the minimum cost path between a signal's source pin and its load pin(s). In general, the maze router is effective in finding high-quality solutions. Its main disadvantage is poor run-time performance.

To improve run-time performance, the concept of "future costing" was introduced. A description of future costing may be found in Soukup, "Fast Maze Router," Proceedings of Design Automation Conference 1978, pp. 100–102. The basic idea in future costing is to use a new cost value (the future cost) to speed up the maze router by pruning and reducing its search space while maintaining the quality of its solution.

Future costing works in the following manner: as the maze router searches for a path in the routing graph between a signal's source pin and one of its load pins, it considers using various nodes from the routing graph in the path to the load pin. As mentioned above, each of these nodes has a certain intrinsic routing cost, which reflects the delay of the node, its length, capacitance, or other criteria. To this intrinsic cost, a future cost is added. The future cost for a node is a lower bound on the cost of the complete path from the node to the target pin being routed. Consequently, the nodes that have low future costs are likely to be the ones used in low-cost paths to the load pin being routed.

Future costing can be thought of as guiding the maze router towards low-cost routing solutions. By exploring favorable paths first and postponing others, it effectively reduces the search space of the maze router. One key aspect of developing a future cost function is to ensure that it does not result in the pruning of high-quality routing solutions and thus damaging the router's quality of result. This condition is met when the future cost is an accurate lower bound on the path cost from a node to the target being routed.

A problem that arises with the use of future cost is that there is no systematic way to determine the future cost function that specifies the future cost values used during routing. The development of a future cost function for a router has historically required a certain amount of "black magic". Many engineering hours need to be spent in pouring over device routing architectures and developing heuristics and experimental parameters in order to arrive at the future cost function. For each device family and speed grade, there is a set of device specific future cost functions that have to be designed and developed from scratch. Once in place, these future cost functions are effective in reducing the overall router run-time, usually by a significant factor. The downside of the conventional method of developing such functions is that the science is not exact, and it is extremely consuming in engineering time.

One aspect of the invention is a new future costing approach. This approach not only provides similar or better run-time improvements as prior approaches, but it is generic and is not device specific. Once this new future cost mechanism is in place, all device families can leverage from and use the same machinery to reap significant run-time benefits.

FIG. 1 is a flow chart of an exemplary routing process 100 of the invention. In step 102, a two-dimensional array (which can be implemented as a simple table, called herein the future cost table) is set up to store future cost data. In step 104, all the future cost data that will be used in subsequent steps is generated. In step 106, process 100 determines whether all the signals have been routed. If all have been routed, process 100 terminates. If signals remain to be routed, the next signal is obtained (step 110). In step 112, the future cost data (obtained from step 104) is used to route a connection between the selected signal's source pin its load pins. Process 100 then returns to step 106.

One novel aspect of the invention is how the future cost values are calculated. In the invention, these values are generated dynamically, and they accurately represent the low-bound estimated cost to complete a route from a given node to a target pin node. In an embodiment, to populate the values of the future cost table, pre-routing on an empty device is performed without any signal obstructions. The table (mentioned in step 102) is used to record the minimum costs required to route from a pre-defined source to all nodes in the device.

Figure 2:
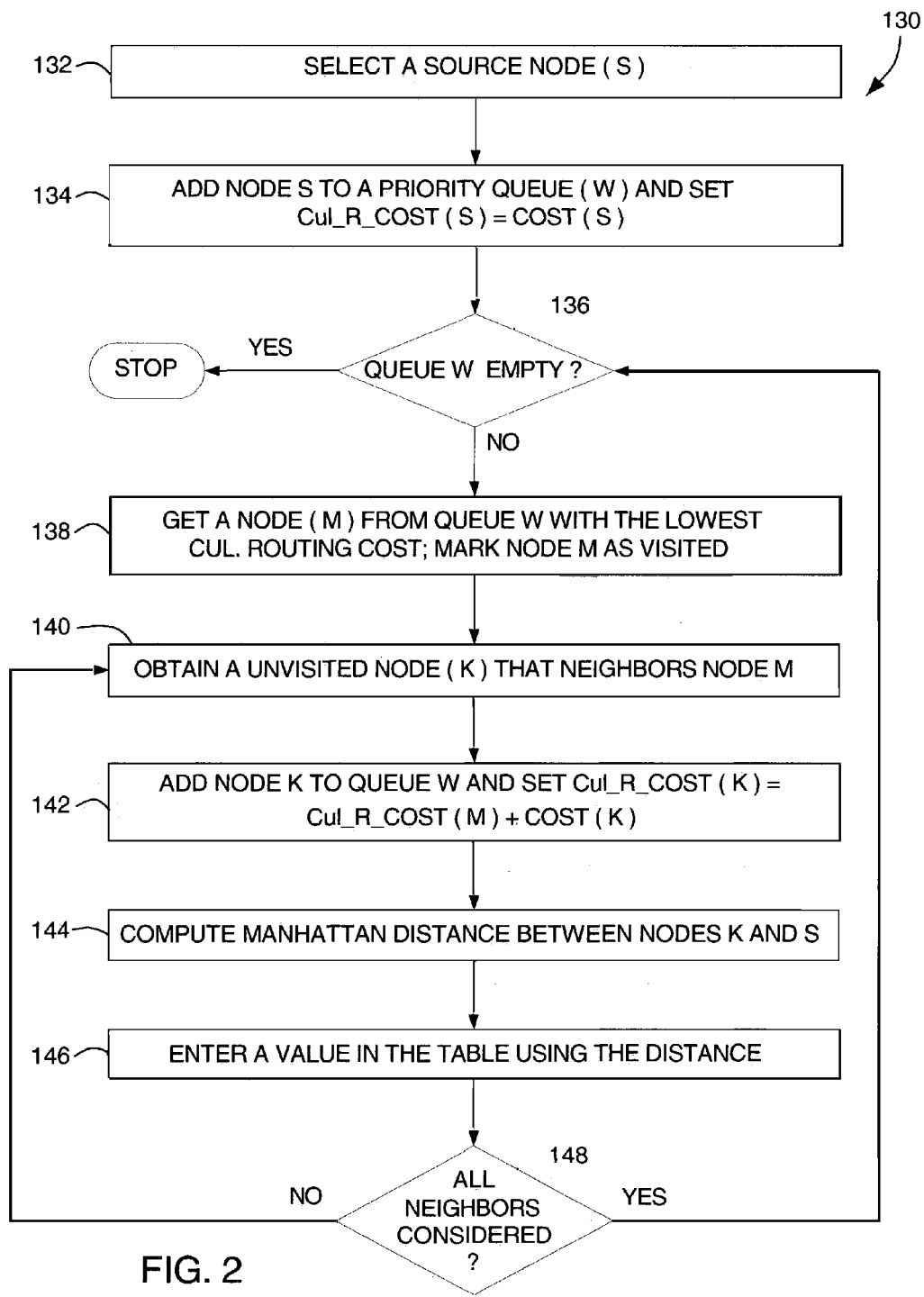
FIG. 2 is a flow chart showing an exemplary embodiment of a process that can be used to calculate a future cost.

FIG. 2 shows an exemplary process 130 that can be used to calculate the future cost in accordance with the invention. Each node in the PLD is assigned a two-dimensional coordinate (X and Y). In this embodiment, it is assumed that each node (e.g., node N) has a cost. The cost is designated as Cost (N). It should be noted that the invention is applicable to both resource, delay, and other routing costs. Further, node N is also associated with a cumulative routing cost, Cul_R Cost(N), representing the sum of the individual node costs on a path from the pre-defined source node to the node, N. The formula for computing this cumulative cost will be described below.

In step 132, a source node (S) is selected. In applying this method to an FPGA, a CLB output located in the corner of a FPGA can be selected as the source. The intrinsic routing cost of node S is calculated, and is designated Cost(S) in process 130. In step 134, node S is added to a priority queue (W). The cumulative routing cost of node S, designated as Cul_R_Cost(S), is initially set equal to Cost(S). In step 136, process 130 determines whether queue W is empty. If the queue is empty, process 130 terminates.

If the queue is not empty, process 130 obtains a node (M) from queue W that has the lowest cumulative routing cost. This node M is now marked as "visited" (step 138). When step 138 is first performed, source node S is the only node in queue W. It is automatically treated as node M in this iteration. In step 140, process 130 obtains an unvisited node (K) that neighbors node N in the routing graph (there is an edge between nodes K and M in the routing graph). In step 142, node K is added to queue W. This node is now selectable in the next iteration of step 138. The cumulative routing cost of node K is set equal to the sum of the cumulative routing cost of node M, Cul_R_Cost (N), and the routing cost, Cost(K), of node K. This cumulative routing cost will be used in the computation of the cumulative routing cost of node K's neighboring nodes, if node K is selected in a subsequent iteration of step 138.

In step 144, process 130 computes the Manhattan distance between nodes K and S. Two distance values (delta X and delta Y) are obtained, one for the x-dimension and one of the y-dimension. These x and y distance values are used to index a value in the future cost table. In step 146, a cost value is entered into the table at a location determined by this coordinate. This cost value is equal to the minimum of the cumulative routing cost of node K (see above in connection with step 142) and the existing future cost value in the table. In step 148, process 130 determines whether all the neighbors of node N have been considered. If not all the neighbors have been considered, process 130 jumps back to step 140 and obtains another unvisited node that neighbors node N. If all the neighbors have been considered, process 130 jumps back to step 136.

Figure 3:
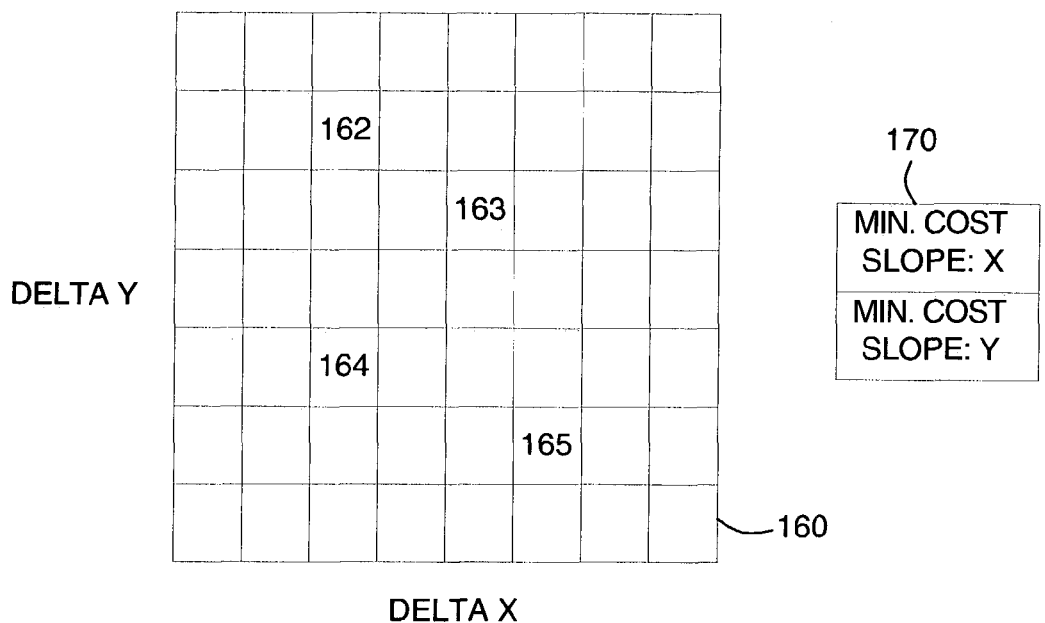
FIG. 3 shows an exemplary future cost table.

At the end of process 130, each entry of the future cost table contains a numerical value that represents a lower bound on the cumulative routing cost required to route a specific distance. An exemplary future cost table 160 is shown in FIG. 3. Future cost data are entered into various locations inside table 160, such as locations 162–165.

In summary, the minimum future cost values are stored and organized in a two-dimensional array such that the indices represent the vertical and horizontal Manhattan distances between two nodes. In order to query the future cost value for a target that is M horizontal units and N vertical units away from the current node, one could simply look up and retrieve the value located at array location. (M, N). It is important to consider the amount of run-time in executing process 130 of FIG. 2 because it may be significant relative to the overall router run-time required to route all user signals.

In the above-described embodiment, a single "expansion" is used to find and record the minimum cost paths from the pre-defined source to each node in the device. Each node in the routing graph is visited at most once in such an expansion procedure. In another embodiment, the future cost table need not be computed at router run-time. The table could be pre-computed using process 130 and its contents stored on disk. When the router is invoked, it would simply read the table from the disk, prior to commencing to route signals. Note that this table may be re-generated whenever the underlying integrated circuit experiences changes in its routing connectivity, or changes in its routing delays, or when the costs assigned to the nodes in the routing graph change.

Figure 4:
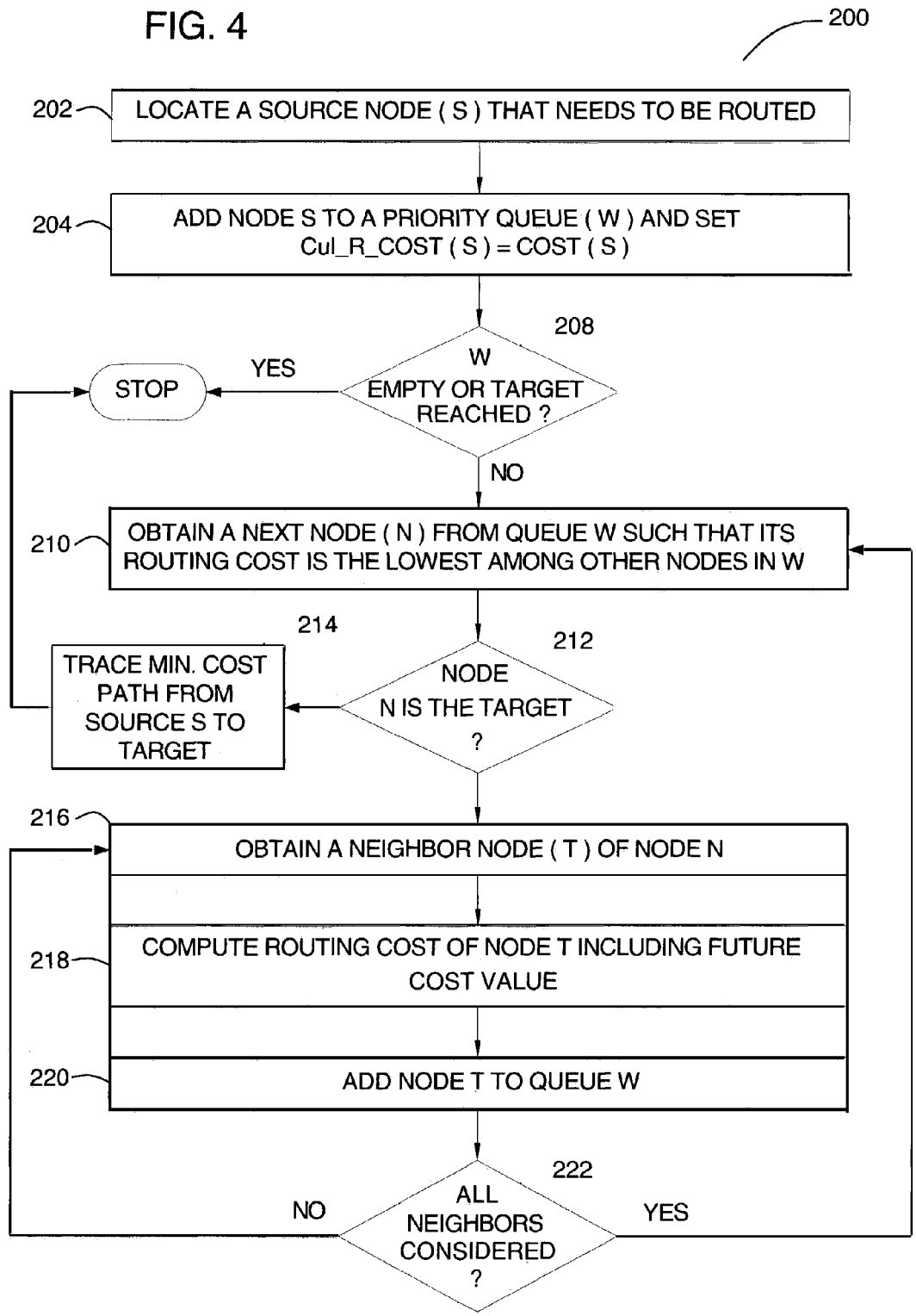
FIG. 4 is a flow chart showing an exemplary embodiment of a process that can be used to route a connection between a signal source pin and a signal load pin using a future cost.

A process 200 for routing connections using the future cost of the invention is shown in FIG. 4. Note that process 200 provides a detailed description of step 112 of FIG. 1. In step 202, the source node S corresponding to the source pin of the signal being routed is located. (The signal being routed is identified in step 110 of FIG. 1.) The routing cost of this node is calculated, and is designated Cost(S) in process 200. In step 204, node S is added to a priority queue W. The cumulative routing cost, Cul_R_Cost(S), is initially set equal to Cost(S).

In step 208, process 200 determines whether queue W is empty. If the queue is empty, process 200 terminates. If the queue is not empty, process 200 obtains the next node in the routing, node (N), from queue W (step 210). In this embodiment, node N has the lowest cumulative routing cost among all the nodes in queue W. When step 210 is first performed, source node S is the only node in queue W. It is automatically treated as the node N. Process 200 is used for routing from the source pin of a net to a given target load pin on the net. The target load pin has a corresponding target node in the routing graph.

In step 212, process 200 determines whether node N is the target node. If this is the target node, the minimum cost routing path can be found by tracing back from this target node to the source node S. If this is not the target node, a neighbor node (T) of node N is obtained (step 216). Node T can be an arbitrary neighbor node because, as explained below, all the neighbor nodes will be considered. The Manhattan distance (in the X and y directions) between node T and the target node is calculated. These two distance values are used as indices to locate a corresponding entry in the future cost table.

The routing cost of node T, Cul_R_Cost(T), is set equal to the sum of the cumulative routing cost of node N, Cul_R_Cost(N), the routing cost of T, Cost(T), and the corresponding entry in the future cost table (step 218). Node T is then added to priority queue W (step 220). This node is now selectable in the next iteration of step 210. The cumulative routing cost Cul_R_Cost(T) will be used in the computation of the cumulative routing cost of its neighboring nodes, if T is selected in a subsequent iteration of step 210.

In step 222, process 200 determines whether all the neighbor nodes of node N have been considered. If the answer is negative, process 200 returns to step 216 (obtain another neighbor node of node N). If the answer is positive, process 200 returns to step 210 (obtain another node in queue W).

A different embodiment for generating a future cost table is now described. In order to reduce or limit the run-times of generating the future cost table associated with large devices, the search space of process 130 on the device can be bounded. Pre-defined maximum horizontal and vertical limits, labeled as Max_X and Max_Y are assigned. This means that the recorded future cost table will contain entries up to Max_X and Max Y distances from the source. If step 218 of process 200 encounters targets that lay outside of these distance limits, future cost values can be estimated using the entries located in the table, as explained below.

In order to facilitate the estimation, memory locations 170, shown in FIG. 3, can be used to store minimum cost future cost slopes for the x and y dimensions. In this embodiment, the cost slopes are equal to the quotient of dividing the future cost by the corresponding Manhattan distance. When a future cost data value is stored in a future cost table (step 146 of process 130), the cost slope is computed by dividing the current cost with the current x,y-Manhattan distances. A computed cost slope for the x or y dimension will replace its corresponding value in memory location 170 if the computed value is less than the existing value.

As a result, at the end of process 130, memory location 170 stores the current minimum cost slope for both the x and y dimensions. A future cost value for a node outside of the distance limit (Max_X, Max_Y) can be computed by multiplying the x,y-Manhattan distances from that node to the target with the minimum cost slope values in memory location 170. In essence, this method provides a conservative lower bound estimation based on known future cost values.

As described below, to further increase the accuracy of the future cost values, different types of device nodes can be considered separately. For example, in an FPGA environment, distinctions can be made wire segments of different lengths, for example, long lines, hex lines, double lines, etc. Also, distinctions can be made between different target load pin types, for example, logic block input pins, clock pins, etc. Separate future cost tables can be generated for each type of resource, thus improving the accuracy of the future cost function and further pruning the search space of the router.

This new invention yields improvements in router runtime that are similar or better than prior methods. In addition, the computation of the future cost function is generic and is de-coupled from the device-specific structure of an integrated circuit. Both PLDs and other types of integrated circuit implementation technologies can benefit from this invention.

Figure 5:
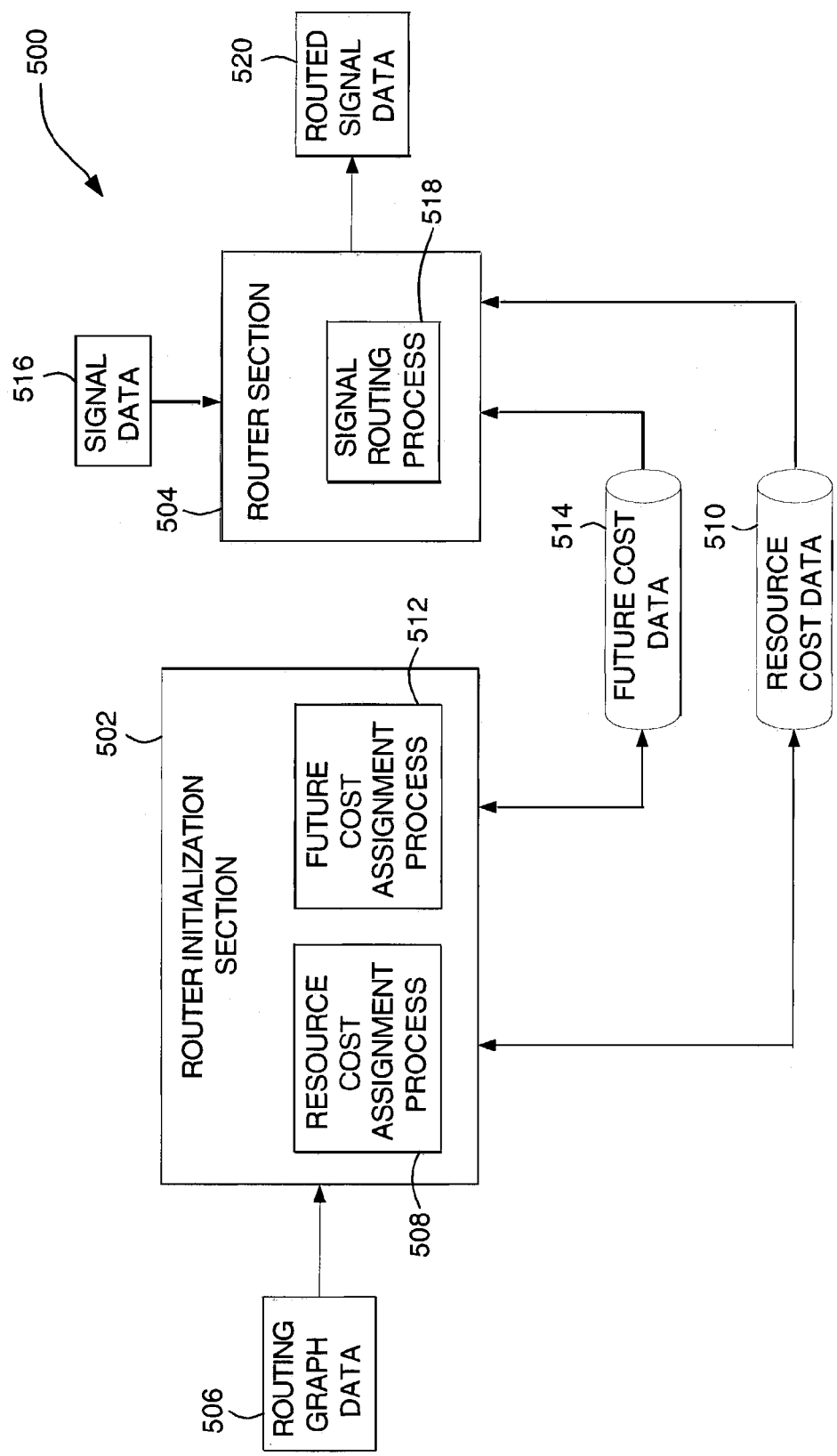
FIG. 5 is a block diagram depicting an exemplary embodiment of a system for routing signals within an integrated circuit.

FIG. 5 is a block diagram depicting a system 500 for routing signals within an integrated circuit. System 500 includes a router initialization section 502 and a router section 504. An input of router initialization section 502 receives routing graph data for an integrated circuit ("routing graph data" 506). As described above, routing graph data 506 includes a set of nodes representing routing resources within the integrated circuit and directed edges corresponding to routing resources that can be electrically connected to one another. Router initialization section 502 executes a resource cost assignment process 508 using the routing graph data 506 to produce resource cost data 510. Router initialization section 502 also executes a future cost assignment process 512 using the routing graph data 506 and the resource cost data 510 to produce future cost data 514.

In an embodiment, future cost assignment process 508 is performed as described above with respect to FIGS. 1 and 2. Notably, the cost value associated with a node, which is designated as Cost(N), is determined in accordance with resource cost assignment process 508. Resource assignment process 508 is described in detail below.

An input of router section 504 receives data corresponding to signals-that are to be routed within the integrated circuit ("signal data" 516). Router section 504 executes a signal routing process 518 using signal data 516, future cost data 514, and resource cost data 510 to produce routed signal data 520. In an embodiment, signal routing process 518 is performed as described above with respect to FIG. 4.

Figure 6:
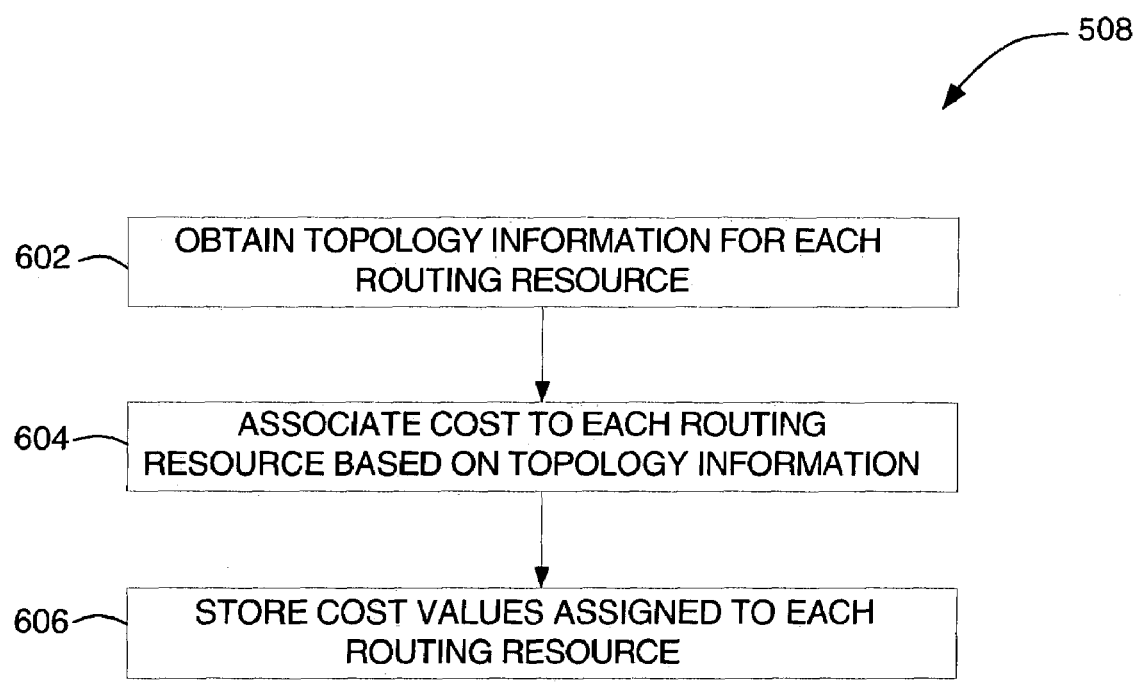
FIG. 6 is a flow diagram depicting an exemplary embodiment of resource cost assignment process for use with the system of FIG. 5.

In an embodiment, resource cost assignment process 508 utilizes topology information for each routing resource in the integrated circuit to determine resource cost data 510. FIG. 6 is a flow diagram depicting an exemplary embodiment of resource cost assignment process 508. Process 508 begins at step 602, wherein the topology information of each resource is obtained. At step 604, each routing resource is assigned a cost value based on the topology information. At step 606, the cost value assigned to each routing resource is stored in a table. For purposes of clarity by example, process 508 depicted in FIG. 6 is applied to an FPGA. Those skilled in the art will appreciate, however, the process 508 depicted in FIG. 6 may be applied to other types of integrated circuits.

Figure 7:
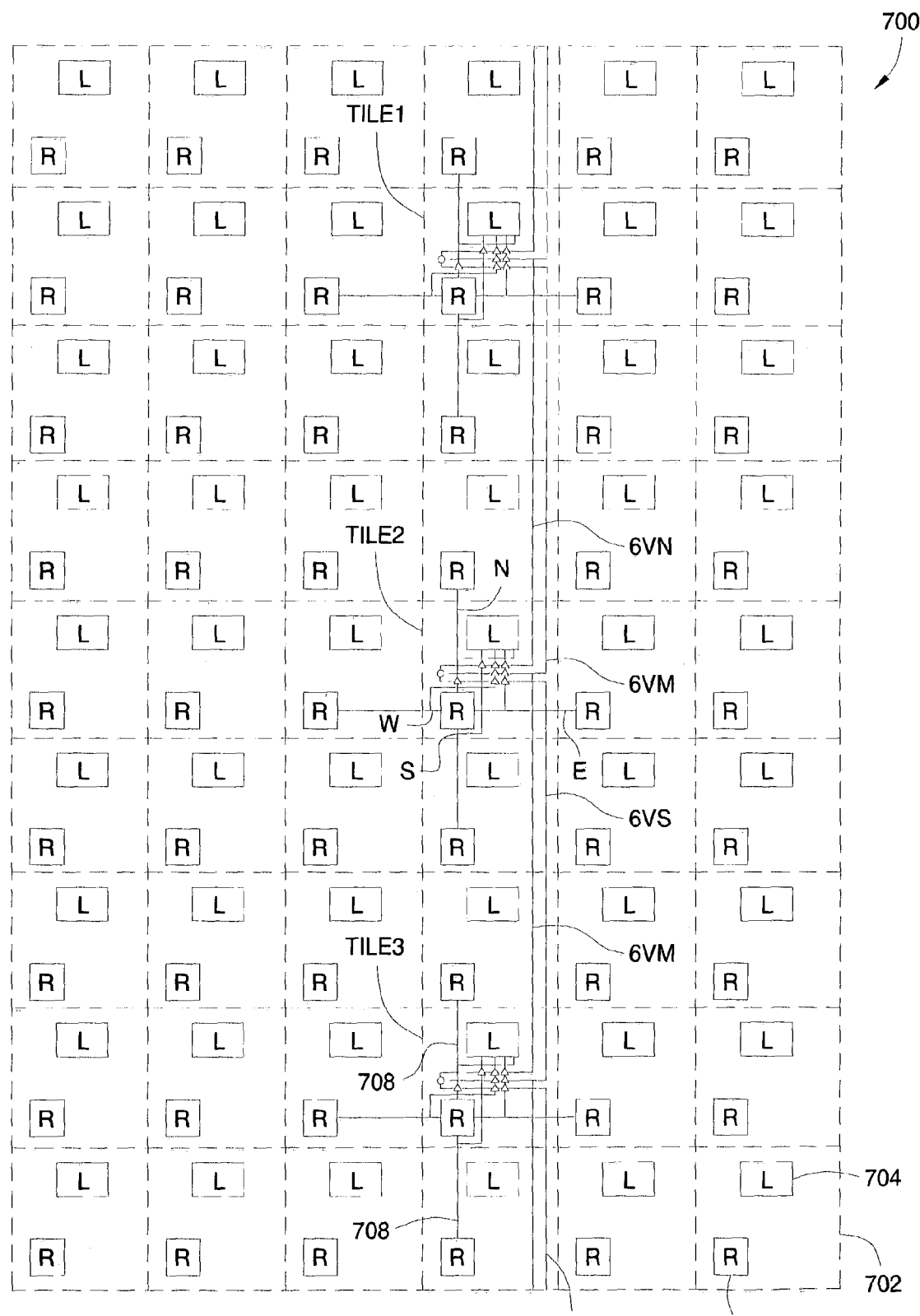
FIG. 7 is a block diagram showing an exemplary embodiment of a portion of an FPGA.

FIG. 7 is a block diagram showing an exemplary embodiment of a portion 700 of an FPGA. Portion 700 includes an array of tiles 702. Each of tiles 702 includes logic block 704 and a routing or switching structure 706. Each of tiles 702 further includes wire segments which connect to other wire segments in adjacent tiles to form interconnect wires 708. Most of interconnect wires 708 in the FPGA are not shown in FIG. 7 for purposes of clarity. Three of tiles 702, labeled TILE1, TILE2, and TILE3 are shown in more detail, and interconnect wires extending from TILE1, TILE2, and TILE3 are shown. In the FPGA of FIG. 7, programmable connections are provided by using PIPs 710, wherein each of PIPs 710 includes at least one transistor.

Notably, an FPGA may be viewed as a collection of logic and routing resources organized in a regular tiled fashion. Each tile (a region of logic and routing resources) is replicated as needed on the device. Each wire may span one or more such tiles. For example, the lines labeled N, E, S and W span one tile while the lines labeled 6VM, 6VN and 6VS span more than three tiles. Each wire's topology is precisely defined by the set of tiles that it spans. These spanning tiles are contiguous and serve as a wire's footprint in a FPGA device. From these tiles, the wire length can be computed by recording the number of the tiles that the wire intersects; this is referred to as a wire's "span." In an embodiment, the resource cost of a wire may be the assignment of its span.

Note that a user may define a topology for cost assignment purpose to be different from the physical architecture of the resources. For example, another user may desire to use a topology such that a group of four adjacent tiles 702 is considered one unit. Alternatively, a third user may subdivide tiles 702 into a number of sub-units. As used herein, the unit of measurement for cost purpose is called a topology unit. In an embodiment, the topology comprises a plurality of rectangular or square topology units. The span of a wire is determined using the user-defined topology.

In another embodiment, a dominant dimension of a wire is used as its span. In other words, the resource cost can be assigned as the maximum between the vertical and the horizontal spans (referred herein as a wire's dominant span). For wires that have unequal horizontal and vertical spans, as commonly found in a FPGA device, the dominant span adapts nicely with Maze routing. Since a Maze router only considers at most one single direction at a time, it is quite fitting to only consider a wire's horizontal or vertical component. Additional detail regarding resource cost assignment using integrated circuit topology is described in U.S. Pat. No. 6,501,297, issued Dec. 31, 2002, which is incorporated by reference herein in its entirety.

Figure 8:
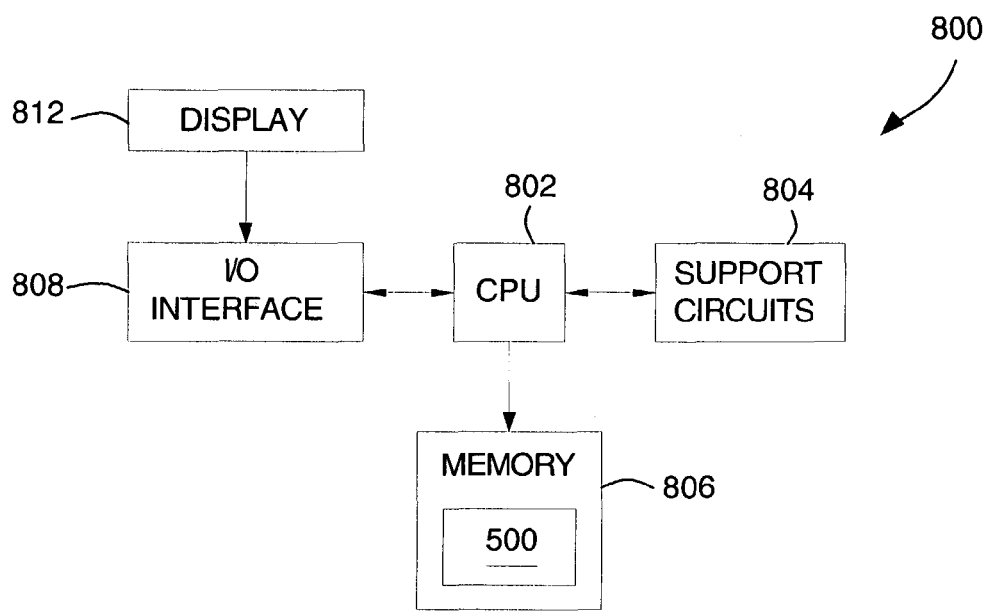
FIG. 8 is a block diagram showing an exemplary embodiment of a computer system for executing the processes of the invention.

FIG. 8 depicts a block diagram showing an exemplary embodiment of a computer system 800 suitable for implementing processes and methods in accordance with one or more aspects of the invention. Computer system 800 includes a central processing unit (CPU) 802, memory 806, a variety of support circuits 804, and an I/O interface 808. CPU 802 may be any type of microprocessor known in the art. Support circuits 804 for CPU 802 include conventional cache, power supplies, clock circuits, data registers, I/O interfaces, and the like. I/O interface 808 may be directly coupled to memory 806 or coupled through CPU 802, and may be coupled to a conventional keyboard, network, mouse, printer, and interface circuitry adapted to receive and transmit data, such as data files and the like. I/O interface 808 may be coupled to a display 812.

Memory 806 may store all or portions of one or more programs or data to implement the processes and methods of the invention. Although exemplary embodiments of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as application specific integrated circuits (ASICs).

Computer system 800 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 806. Memory 806 may include one or more of the following random access memory, read only memory, magneto-resistive read/write memory, optical read/write memory, cache memory, magnetic read/write memory, and the like, as well as signal-bearing media as described below. Memory 806 may store all or a portion of routing system 500 of FIG. 5.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Method, apparatus, and computer readable medium for determining signal routing cost within an integrated circuit is described. A resource cost assignment process is utilized based on integrated circuit topology. In addition, a future cost assignment process that dynamically generates future cost values to represent the low-bound estimated cost is used to complete a route from a given node to a target pin node. In this manner, a generic router is provided that may be used to dynamically assign resource cost values and future cost values for various integrated circuit architectures.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for determining signal routing cost for an integrated circuit, the integrated circuit having topology units and routing resources, the method comprising:
   determining a respective span in terms of one or more of the topology units for each of the routing resources, wherein each of the topology units is substantially same to the other topology units;
   assigning a cost value to each of the routing resources using the respective span associated therewith;
   selecting a routing resource from the routing resources;
   calculating at least one distance between the routing resource and at least one other of the routing resources; and
   computing a future cost value for the at least one distance using the cost value assigned to the routing resource.

2. The method of claim 1, further comprising storing the future cost value for the at least one distance in a two-dimensional table indexed by a vertical distance and a horizontal distance.

3. The method of claim 1, wherein the routing resource is located at one corner of the integrated circuit.

4. The method of claim 3, wherein the integrated circuit is a programmable logic device and the topology units are associated with programmable logic blocks within the programmable logic device.

5. The method of claim 1, wherein the calculating and the computing comprises:
   determining a cumulative routing cost of the at least one other of the routing resources;
   obtaining a distance calculated between the first routing resource and the at least one other of the remaining routing resources; and
   setting the future cost value equal to the cumulative routing cost if there is no existing future cost value corresponding to the distance or if the cumulative routing cost is less than an existing future cost value corresponding to the distance.

6. The method of claim 5, wherein the cumulative routing cost of the at least one other of the remaining routing resources includes a cumulative routing cost of the routing resource and the cost assigned to the at least one other of the remaining routing resources.

7. The method of claim 1, wherein the determining comprises identifying a number of topology units the routing resource intersects in at least one of a vertical direction and a horizontal direction.

8. A method of routing a signal within an integrated circuit, the integrated circuit having topology units and routing resources, the method comprising:
   determining a respective span in terms of one or more of the topology units for each of the routing resources, wherein each of the topology units is substantially same to the other topology units;
   assigning a cost value to each of the routing resources using the respective span associated therewith;
   selecting a routing resource from the routing resources;
   calculating at least one distance between the routing resource and at least one other of the routing resources;
   computing a future cost value for the at least one distance using the cost value assigned to the routing resource; and
   determining a signal path from a source routing resource to a destination routing resource using the future cost value computed for the distance between the source routing resource and the destination routing resource.

9. The method of claim 8, further comprising repeating the determining a signal path for additional pairs of source and destination routing resources.

10. The method of claim 8, further comprising storing the future cost value for the at least one distance in a two-dimensional table indexed by a vertical distance and a horizontal distance.

11. The method of claim 8, wherein the determining a span comprises, for each routing resource, identifying a number of topology units the routing resource intersects in at least one of a vertical direction and a horizontal direction.

12. A computer readable medium having stored thereon instructions that, when executed by a processor, cause the processor to perform a method of determining signal routing cost within an integrated circuit, the integrated circuit having topology units and routing resources, the method comprising:
 determining a respective span in terms of one or more of the topology units for each of the routing resources, wherein each of the topology units is substantially same to the other topology units;
 assigning a cost value to each of the routing resources using the respective span associated therewith;
 selecting a routing resource from the routing resources;
 calculating at least one distance between the routing resource and at least one other of the routing resources; and
 computing a future cost value for the at least one distance using the cost value assigned to the routing resource.

13. An apparatus for determining signal routing cost within an integrated circuit, the integrated circuit being divided into topology units and having routing resources, the apparatus comprising:
 means for assigning a cost value to each of the routing resources using a respective span associated therewith, the span being measured in terms of one or more of the topology units, wherein each of the topology units is substantially same to the other topology units;
 means for calculating at least one distance between a first routing resource and at least one other of the routing resources; and
 means for computing a future cost value for the at least one distance using the cost value assigned to the first routing resource.

14. A system for determining signal routing cost within an integrated circuit, the system comprising:
 a processing unit having access to one or more storage devices;
 at least a portion of the one or more storage devices having topology data and routing resource data associated with the integrated circuit; and
 at least another portion of the one or more storage devices having a program product configured to:
  select routing resources from the routing resource data;
  determine a respective span in terms of one or more topology units of the topology data for each of the routing resources, wherein each of the topology units is substantially same to the other topology units;
  assign a cost value to each of the routing resources using the respective span associated therewith;
  select a routing resource from the routing resources;
  calculate at least one distance between the routing resource and at least one other of the routing resources; and
  compute a future cost value for the at least one distance using the cost value assigned to the routing resource.

15. A system for routing a signal within an integrated circuit, the integrated circuit having topology units and routing resources, the system comprising:
 a router initialization section for assigning a cost value to each of the routing resources using a respective span associated therewith, the span being measured in terms of one or more of the topology units, for calculating at least one distance between a first routing resource and at least one other of the routing resources, and for computing a future cost value for the at least one distance using the cost value assigned to the first routing resource, wherein each of the topology units is substantially same to the other topology units; and
 a router section for determining a signal path from a source routing resource to a destination routing resource using the future cost computed for the distance between the source routing resource and the destination routing resource.

16. A method of determining signal routing cost for an integrated circuit having blocks of circuitry and having routing resources for interconnecting at least a portion of the blocks of circuitry, the method comprising:
 identifying interconnects for the routing resources;
 describing each span of the interconnects in terms of circuitry blocks in association with the blocks of circuitry, wherein the circuitry blocks is substantially same topology;
 assigning a routing cost to a respective one of the interconnects until each of the interconnects has been assigned a respective cost of routing, wherein the routing cost is for each of the interconnects is responsive to the circuitry blocks respectively used to describe the interconnects;
 selecting each of the routing resources;
 determining each distance between a routing resource selected and the routing resources remaining to provide distances; and
 calculating a future cost for each of the distances responsive to the routing cost associated therewith.

17. The method of claim 16, further comprising storing the future cost for each of the distances in a two-dimensional table indexed by vertical and horizontal distances.

18. The method of claim 16, wherein the routing resource is located at one corner of the integrated circuit.

19. The method of claim 16, wherein the integrated circuit is a programmable logic device.

20. The method of claim 19, wherein the routing resources are associated with programmable logic blocks within the programmable logic device.

* * * * *